(12) United States Patent  
Kusunoki et al.

(10) Patent No.: US 10,669,422 B2  
(45) Date of Patent: Jun. 2, 2020

(54) CONDENSATION-CURABLE SILICONE RESIN COMPOSITION

(71) Applicant: Shin-Etsu Chemical Co., Ltd., Tokyo (JP)

(72) Inventors: Takayuki Kusunoki, Annaka (JP); Tomoyuki Mizunashi, Annaka (JP); Yuusuke Takamizawa, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 15/679,901

(22) Filed: Aug. 17, 2017

(65) Prior Publication Data

US 2018/0051138 A1   Feb. 22, 2018

(30) Foreign Application Priority Data

Aug. 19, 2016   (JP) ................. 2016-161363

(51) Int. Cl.

| | |
|---|---|
| C08L 83/04 | (2006.01) |
| H01L 23/29 | (2006.01) |
| H01L 33/56 | (2010.01) |
| C08K 5/544 | (2006.01) |
| C08G 77/08 | (2006.01) |
| C08G 77/18 | (2006.01) |
| C08G 77/16 | (2006.01) |

(52) U.S. Cl.

CPC .............. *C08L 83/04* (2013.01); *C08G 77/08* (2013.01); *C08K 5/544* (2013.01); *C08K 5/5442* (2013.01); *H01L 23/296* (2013.01); *H01L 33/56* (2013.01); *C08G 77/16* (2013.01); *C08G 77/18* (2013.01)

(58) Field of Classification Search

CPC ...... H01L 23/296; H01L 33/56; C09D 183/00  
See application file for complete search history.

(56) References Cited

U.S. PATENT DOCUMENTS

| | | | | |
|---|---|---|---|---|
| 4,417,042 A | * | 11/1983 | Dziark | C08L 83/16 |
| | | | | 528/18 |
| 4,536,540 A | * | 8/1985 | Dziark | C08K 3/00 |
| | | | | 524/701 |
| 5,232,982 A | | 8/1993 | Lucas | |
| 5,925,709 A | * | 7/1999 | Takahashi | C08L 83/04 |
| | | | | 524/492 |
| 2004/0236056 A1 | * | 11/2004 | Schindler | C08G 77/54 |
| | | | | 528/38 |
| 2006/0069176 A1 | | 3/2006 | Bowman et al. | |
| 2006/0115657 A1 | | 6/2006 | Griswold | |
| 2007/0099009 A1 | | 5/2007 | Shimizu et al. | |
| 2007/0254975 A1 | | 11/2007 | Arney et al. | |
| 2015/0133594 A1 | * | 5/2015 | Ihara | C08G 77/44 |
| | | | | 524/500 |

FOREIGN PATENT DOCUMENTS

| | | |
|---|---|---|
| JP | 2007-119569 A | 5/2007 |
| JP | 2008-525627 A | 7/2008 |
| JP | 2011-219729 A | 11/2011 |
| JP | 2016-8246 A | 1/2016 |

OTHER PUBLICATIONS

Extended European Search Report dated Jan. 5, 2018, in European Patent Application No. 17185564.6.

* cited by examiner

*Primary Examiner* — Marc S Zimmer  
(74) *Attorney, Agent, or Firm* — Birch, Stewart, Kolasch & Birch, LLP

(57) ABSTRACT

One of the purposes of the present invention is to provide a condensation-curable silicone resin composition which show a less increase of the viscosity during handling and cures quickly to provide a cured product which has a very small amount of a remaining catalyst and which has high heat resistance and high light resistance. Thus, the present invention is to provide a condensation-curable silicone composition comprising the following components (A) to (C): (A) 100 parts by mass of an organopolysiloxane which has a branched or network structure and has two or more hydrolyzable groups each bonded to a silicon atom and at least one of $(R^1SiO_{3/2})$ and $(SiO_{4/2})$ units, wherein $R^1$ is, independently of each other, a hydrogen atom or a substituted or unsubstituted, monovalent hydrocarbon group having 1 to 12 carbon atoms, (B) 5 to 500 parts by mass of a linear organopolysiloxane having at least one hydrolyzable group bonded to a silicon atom at each of both terminals, and (C) at least one silazane compound represented by the following general formula (3) or (5) or comprising the following units (6) in an amount of 0.02 to 30 parts by mass, relative to total 100 parts by mass of components (A) and (B):

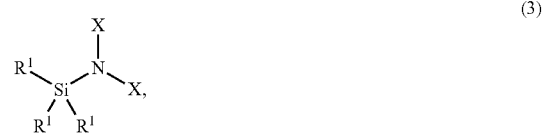

(3)

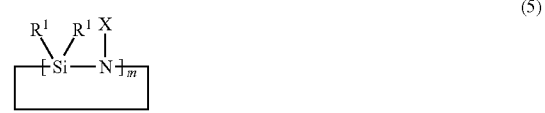

(5)

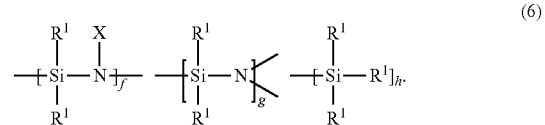

(6)

9 Claims, No Drawings

CONDENSATION-CURABLE SILICONE RESIN COMPOSITION

CROSS REFERENCE

This application claims the benefits of Japanese Patent Application No. 2016-161363 filed on Aug. 19, 2016, the contents of which are herein incorporated by reference.

FIELD OF THE INVENTION

The present invention relates to a condensation-curable silicone resin composition.

Condensation-curable organopolysiloxanes have been used generally as materials for adhesive agents, waterproof or moistureproof coating materials, electrical insulating films and construction sealants. Condensation-curable organopolysiloxanes have good heat resistance, light resistance and transparency and, therefore, draw attention as materials for encapsulating photodiodes such as LEDs. A curing rate is important for a resin to be used in industrial applications. However, reactivity of condensation-curable organopolysiloxanes is lower than that of addition-curable organopolysiloxanes and, therefore, the productivity of a cured product is poorer. If a large amount of the condensation catalyst is used in order to improve the reactivity, degradation of the silicone resin is also accelerated and, therefore, the intrinsic high heat resistance and light resistance are not attained. Further, the catalyst sometimes has color or sometimes becomes to have color by degradation. Therefore, many of the condensation catalysts are not suitable in the fields which need transparency.

Various developments have been made on condensation-curable organopolysiloxanes. Japanese Patent Application Laid-Open No. 2011-219729 describes that a phosphate ester and a boron compound is added in addition to a metal catalyst such as aluminum or zinc compounds in a composition comprising an organopolysiloxane having at least two silanol groups and an organopolysiloxane having at least two alkoxy groups each bonded to a silicon atom and, thereby, the curing rate is improved while minimizing degradation of the resin. Japanese Patent Application Laid-Open No. 2016-8246 describes that a composition comprising a partial hydrolysis and condensation product of tetraalkoxysilane or trialkoxysilane and a linear organopolysiloxane having silanol groups at both terminals is cured in the presence of a volatile amine catalyst and, thereby, the amount of the catalyst remaining in a cured product is decreased. Japanese Patent Application Laid-Open No. 2007-119569 describes that a molecular weight of the condensation-curable organopolysiloxane is made higher in advance and, thereby, gelation of the organopolysiloxane is attained with a fewer reaction steps.

PRIOR LITERATURES

Patent Literatures

[Patent Literature 1] Japanese Patent Application Laid-Open No. 2011-219729

[Patent Literature 2] Japanese Patent Application Laid-Open No. 2016-8246

[Patent Literature 3] Japanese Patent Application Laid-Open No. 2007-119569

DISCLOSURE OF THE INVENTION

Problems to Be Solved by the Invention

However, the aforesaid condensation-curable organopolysiloxane compositions are not satisfactory in the fields required high heat resistance and light resistance.

For instance, in patent literature 1, a large amount of catalyst remains in the cured product of the condensation-curable resin composition and, thereby, the heat resistance and light resistance are poor. In the resin composition described in patent literature 2, the amine catalyst enhances the condensation even at a low temperature, and, therefore, a viscosity of the composition changes significantly and the storage stability and the handling property are poor. Further, when the cured product has a large thickness, the amine catalyst does not sufficiently volatilize and the remaining amine catalyst is degraded by heat and the cured product becomes brown. The condensation-curable organopolysiloxane described in patent literature 3 has a high viscosity because of its high molecular weight and is not suitable to be poured into a concave and, then, cured.

One of the purposes of the present invention is to provide a condensation-curable silicone resin composition which show a less increase of the viscosity during handling and cures quickly to provide a cured product which has a very small amount of a remaining catalyst and which has high heat resistance and high light resistance.

Means to Solve the Problems

To solve the aforesaid problems, the present inventors have made research and found that a silazane compound having the specific structure described below functions well as a condensation catalyst in a condensation-curable silicone resin composition comprising an organopolysiloxane which has a branched or network structure and has two or more hydrolyzable groups each bonded to a silicon atom and a linear organopolysiloxane which has at least one hydrolyzable group bonded to a silicon atom at each of both terminals and, therefore, the condensation-curable silicone composition cures quickly to provide a cured product, even without the conventional condensation catalyst. Further, the cured product obtained via a condensation reaction has high heat resistance and light resistance.

Thus, the present invention is to provide a condensation-curable silicone composition comprising the following components (A) to (C):

(A) 100 parts by mass of an organopolysiloxane which has a branched or network structure and has two or more hydrolyzable groups each bonded to a silicon atom and at least one of ($R^1SiO_{3/2}$) and ($SiO_{4/2}$) units, wherein $R^1$ is, independently of each other, a hydrogen atom or a substituted or unsubstituted, monovalent hydrocarbon group having 1 to 12 carbon atoms, (B) 5 to 500 parts by mass of a linear organopolysiloxane having at least one hydrolyzable group bonded to a silicon atom at each of both terminals, and (C) at least one silazane compound represented by the following general formula (3) or (5) or comprising the following units (6) in an amount of 0.02 to 30 parts by mass, relative to total 100 parts by mass of components (A) and (B):

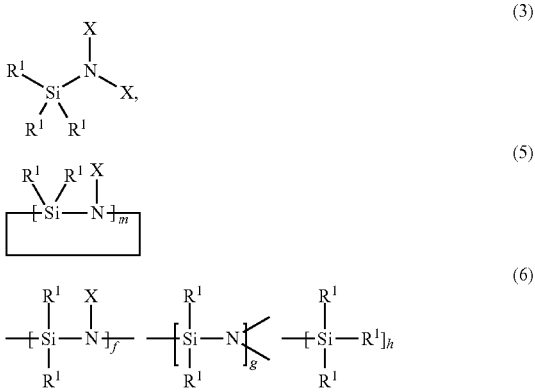

wherein $R^1$ is, independently of each other, a hydrogen atom or a substituted or unsubstituted, monovalent hydrocarbon group having 1 to 12 carbon atoms, m is an integer of from 3 to 8, f is an integer of from 1 to 500, g is an integer of from 0 to 500, h is an integer of from 0 to 200, provided that a total of f, g and h is 10 to 500, the parenthesized silazane units may forma block unit or bond randomly, and X is, independently of each other, a hydrogen atom, a monovalent hydrocarbon group having 1 to 12 carbon atoms, or a group represented by the following formula (4):

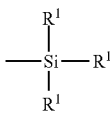
(4)

wherein $R^1$ is, independently of each other, a hydrogen atom or a substituted or unsubstituted, monovalent hydrocarbon group having 1 to 12 carbon atoms.

Further, the present invention provides a method for preparing a cured product by curing a condensation-curable silicone composition comprising the aforesaid components (A), (B) and (C), wherein the method comprises a step of reacting components (A) and (B).

Effects of the Invention

On account of the specific silazane compound in the condensation-curable silicone resin composition, the change of the viscosity is prevented during handling and the composition condensation-reacts quickly to provide a cured product. Further, the silazane compound hydrolyzes quickly in the curing reaction to thereby form ammonia having the silazane-origin nitrogen atom and, then, the ammonia volatilizes. Therefore, the catalyst does not remain in the cured product, unlike the conventional catalysts such as organic metal compounds, e.g., metal alkoxides. Accordingly, the present composition provides a cured product having high heat resistance and light resistance.

BEST MODE OF THE INVENTION

The present invention will be described below in detail.

(A) Organopolysiloxane Having a Branched or Network Structure

Component (A) is an organopolysiloxane which has a branched or network structure and has two or more hydrolyzable groups each bonded to a silicon atom and at least one of $(R^1\text{---}SiO_{3/2})$ and $(SiO_{4/2})$ units, wherein $R^1$ is, independently of each other, a hydrogen atom or a substituted or unsubstituted, monovalent hydrocarbon group having 1 to 12 carbon atoms. Any known organopolysiloxane having a branched or network structure may be used as long as it has at least two, preferably 2 to 100 hydrolyzable groups each bonded to a silicon atom. Examples of the hydrolyzable groups include a hydroxyl group or an alkoxy or alkoxyalkoxy group having 1 to 6 carbon atoms. The organopolysiloxane having the branched or network structure has $(R^1SiO_{3/2})$ unit, T unit, and/or $(SiO_{4/2})$ unit, Q unit, and the total number of T and Q units in the molecular is preferably 3 to 500. Further, the organopolysiloxane may has 0 to 500 $(R^1_3SiO_{1/2})$ units, M units, and 0 to 1000 $(R^1_2SiO_{2/2})$ units, D units. The organopolysiloxane may be solid, semisolid or liquid at 25 degrees C.

In the present invention, "semisolid" means that the organopolysiloxane has a certain fluidity at room temperature, but is so viscous that it is difficult to measure a viscosity with a rotational viscometer. Alternatively, "semisolid" means that the organopolysiloxane is not sold, but less flowable enough to maintain a shape fluidity at room temperature.

Component (A) is preferably an organopolysiloxane represented by the following general formula (1).

$$(R^1_3SiO_{1/2})_a(R^1_2SiO_{2/2})_b(R^1SiO_{3/2})_c(SiO_{4/2})_d(O_{1/2}R^2)_e \tag{1}$$

wherein $R^1$ is, independently of each other, a hydrogen atom or a substituted or unsubstituted, monovalent hydrocarbon group having 1 to 12 carbon atoms, $R^2$ is, independently of each other, a hydrogen atom or a monovalent hydrocarbon group which has 1 to 6 carbon atoms and may have an oxygen atom, a is an integer of from 0 to 500, b is an integer of from 0 to 1,000, c is an integer of from 0 to 500, d is an integer of from 0 to 500, provided that a total of c and d is 3 to 500, e is an integer of from 2 to 100, and the parenthesized silazane units may form a block unit or bond randomly.

$R^1$ is, independently of each other, a hydrogen atom or a substituted or unsubstituted, monovalent hydrocarbon group having 1 to 12 carbon atoms, preferably 1 to 6 carbon atoms. Examples of the monovalent hydrocarbon group include alkyl groups such as a methyl group, an ethyl group, a propyl group, a butyl group, and a hexyl group; cycloalkyl groups such as a cyclopentyl group and a cyclohexyl group; aryl groups such as a phenyl group, a tolyl group and a naphthyl group; aralkyl groups such as a benzyl group, a phenylethyl group and a phenylpropyl group; and those wherein a part or all of the hydrogen atoms bonded to the carbon atoms are substituted with a substituent such as a halogen atom such as a fluorine atom, a bromine atom and a chlorine atom, a cyano group, a (meth)acryloxy group, a glycidyloxy group, a mercapto group or an amino group, e.g., halogen-substituted monovalent hydrocarbon groups such as a trifluoropropyl and chloropropyl groups, cyanoalkyl groups such as a β-cyanoethyl group and a γ-cyanopropyl group, 3-methacryloxypropyl group, 3-glycidyloxypropyl group, 3-mercaptopropyl group, and 3-aminopropyl group. Among these, a methyl group and a phenyl group are preferred. $R^2$ is, independently of each other, a hydrogen atom or a monovalent hydrocarbon group which has 1 to 6 carbon atoms, preferably 1 to 3 carbon atoms and may have an oxygen atom. Examples of $R^2$ include a hydrogen atom, alkyl groups such as a methyl group, an ethyl group, a propyl group, an isopropyl group, a butyl group, and a hexyl group, and alkoxyalkyl groups such as a methoxymethyl group, a methoxyethyl group and an ethoxyethyl group. Among these, a hydrogen atom, a methyl group, en ethyl group and an isopropyl group.

In the aforesaid formula (1), a is an integer of from 0 to 500, preferably an integer of from 0 to 300. b is an integer of from 0 to 1,000, preferably an integer of from 0 to 500. c is an integer of from 0 to 500, preferably an integer of from 0 to 300. d is an integer of from 0 to 500, preferably an integer of from 0 to 300, provided that a total of c and d is 3 to 500, preferably 5 to 300. e is an integer of from 2 to 100, preferably an integer of from 2 to 60. The parenthesized silazane units may form a block unit or bond randomly. In particular, a part or the whole of the siloxane 0 unit represented by ($R^1{}_2SiO_{2/2}$) may bond sequentially.

The organopolysiloxane having the branched or network structure may be prepared in any known manners. For instance, the organopolysiloxane may be synthesized by hydrolysis and condensation of a halogenated silane or an alkoxysilane. A commercially available organopolysiloxane may be used. A viscosity and a weight-average molecular weight of the organopolysiloxane are such that a to e, that is, the numbers of the siloxane units, are in the aforesaid range.

(B) Linear Organopolysiloxane

Component (B) is a linear organopolysiloxane having at least one hydrolyzable group bonded to a silicon atom at each of both terminals. The linear organopolysiloxane is liquid at 25 degrees C. Any known linear organopolysiloxane may be used. Examples of the hydrolyzable groups include a hydroxyl group and an alkoxy or alkoxyalkoxy group having 1 to 6 carbon atoms. The linear organopolysiloxane preferably has 1 to 2,000, more preferably 10 to 1,000, siloxane units represented by ($R^1{}_2SiO_{2/2}$) units. $R^1$ is, independently of each other, a hydrogen atom or a substituted or unsubstituted, monovalent hydrocarbon group having 1 to 12 carbon atoms.

Component (B) is preferably a linear organopolysiloxane represented by the following general formula (2):

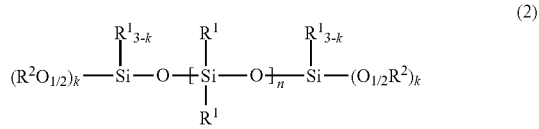

(2)

wherein $R^1$ is, independently of each other, a hydrogen atom or a substituted or unsubstituted, monovalent hydrocarbon group having 1 to 12 carbon atoms, $R^2$ is, independently of each other, a hydrogen atom or a monovalent hydrocarbon group which has 1 to 6 carbon atoms and may have an oxygen atom. $R^1$ and $R^2$ are as described for $R^1$ and $R^2$ in component (A), but they are independent of $R^1$ and $R^2$ in component (A). k is, independently of each other, an integer of from 1 to 3, preferably 1 or 3. n is an integer of from 1 to 2,000, preferably an integer of from 10 to 1,000.

The linear organopolysiloxane (B) may be prepared in any known manners. For instance, the linear organopolysiloxane may be synthesized by hydrolysis and condensation of a halogenated silane or an alkoxysilane. A commercially available linear organopolysiloxane may be used.

The amount of component (B) is 5 to 500 parts by mass, preferably 10 to 450 parts by mass, further preferably 20 to 350 parts by mass, relative to 100 parts by mass of component (A).

(C) Silazane Compound

The present invention is characterized in that component (A) is condensation reacted with component (B) in the presence of at least one silazane compound represented by the following general formula (3) or (5) or comprising the following units (6). Silazane compounds are known as surface treatment agents for inorganic fillers. The present inventors have found that the silazane compound having the specific structure functions well as a catalyst for the condensation of components (A) and (B) and that components (A) and (B) react quickly in the presence of the silazane compound to provide a cured product. The silazane compound is hydrolyzed with heat to form an amine compound and, then, the amine compound will function as a catalyst. On account of the silazane compound, the condensation-curable silicone resin composition can be cured at a sufficiently fast curing rate without conventional catalysts such as an organic metal catalyst and an amine compound catalyst. When the conventional silicone composition comprising the organic metal catalyst or the amine compound catalyst is cured, the catalyst remains in the cured product and, therefore, the heat resistance and the light resistance of the cured product are poor. In contrast, the silazane compound is quickly hydrolyzed in the curing to thereby form ammonia having the silazan-origin nitrogen atom and, then, the ammonia volatilizes. Accordingly, the catalyst does not remain in the cured product. Therefore, the present composition provides a cured product having high heat resistance and light resistance. Further, the change of the viscosity of the present silicone resin composition is small in handling.

(C) silazane compound is at least one selected from the silazane represented by the general formula (3), the cyclic silazane represented by the general formula (5), and the polysilazane having the following units (6).

(3)

(5)

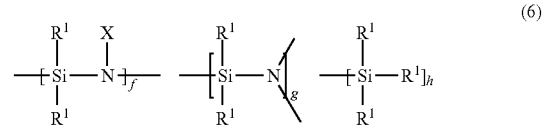

(6)

wherein $R^1$ is, independently of each other, a hydrogen atom or a substituted or unsubstituted, monovalent hydrocarbon group having 1 to 12 carbon atoms, m is an integer of from 3 to 8, f is an integer of from 1 to 500, g is an integer of from 0 to 500, h is an integer of from 0 to 200, provided that a total of f, g and h is 10 to 500, the parenthesized silazane units may form a block unit or bond randomly, and X is, independently of each other, a hydrogen atom, a monovalent hydrocarbon group having 1 to 12 carbon atoms, or a group represented by the following formula (4):

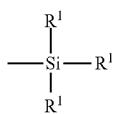

(4)

wherein $R^1$ is, independently of each other, a hydrogen atom or a substituted or unsubstituted, monovalent hydrocarbon group having 1 to 12 carbon atoms.

In the aforesaid formulas (3) to (6), $R^1$ is selected from the groups defined for $R^1$ in component (A), but is independent of $R^1$ in component (A), X is a hydrogen atom, a monovalent hydrocarbon group having 1 to 12 carbon atoms, or a group represented by the formula (4). Examples of the monovalent hydrocarbon group having 1 to 12 carbon atoms are as described for $R^1$ in component (A). In the cyclic silazane represented by the formula (5), an integer of from 3 to 8, preferably an integer of from 3 to 5. In the polysilazane having the following units (6), f is an integer of from 1 to 500, preferably an integer of from 5 to 400, further preferably an integer of from 10 to 200. g is an integer of from 0 to 500, preferably an integer of from 0 to 250, further preferably an integer of from 1 to 140. h is an integer of from 0 to 200, preferably an integer of from 0 to 100, more preferably an integer of from 1 to 50, provided that a total of f, g and h is 10 to 500, preferably 20 to 350.

The aforesaid silazane compounds may be prepared in any known manners. For instance, the silazane compound may be synthesized by a dehydrochlorination reaction of a halogenated silane and an amine compound. A commercially available silazane compound may be used.

Examples of the silazane compound represented by the formula (3) include trimethylsilylamine, bis(trimethylsilyl)amine, tris(trimethylsilyl)amine, methyldiphenylsilylamine, bis(methyldiphenylsilyl)amine, and tris(methyldiphenylsilyl)amine. Examples of the cyclic silazane represented by the formula (5) include hexamethylcyclotrisilazane, octamethylcyclotetrasilazane, decamethylcyclopentasilazane, trimethyltriphenylcyclotrisilazane, tetramethyltetraphenylcyclotetrasilazane, pentamethylpentaphenylcyclopentasilazane, hexaphenylcyclotrisilazane, octaphenylcyclotetrasilazane and decaphenylcyclopentasilazane. Examples of the polysilazane having the units (6), an inorganic polysilazane such as perhydropolysilazane and an organic polysilazane such as a methylpolysilazane. Among these, bis(trimethylsilyl)amine, tris(trimethylsilyl)amine, hexamethylcyclotrisilazane and perhydropolysilazane are preferable in view of availability.

The amount of the silazane compound (C) is 0.02 to 30 parts by mass, preferably 0.05 to 20 parts by mass, further preferably 0.1 to 10 parts by mass, relative to a total 100 parts by mass of components (A) and (B). When the silazane compound is contained in the composition in the aforesaid amount, the composition has a good handling property and provides a cured product quickly.

[Other Additive]

The present silicone composition may further optionally comprise a rare earth element compound. On account of the rare earth element compound, degradation of the cured product is further inhibited even in use where heat resistance and light resistance are required. Examples of the rare earth element compound include an organic complex of a rare earth element, a rare earth element alkoxide and an organic acid salt of a rare earth element. The rare earth element compound may be used singly or in combination of two or more of them.

Examples of the rare earth element compound include an organic complex of a rare earth element such as acetylacetonate and triscyclopentadienyl; a rare earth element alkoxide having an alkoxy group such as an isopropoxy group, an n-butoxy group and an isobutoxy group; an organic acid salt of a rare earth element via an organic acid such as octylic acid, lauric acid and pivalic acid. Examples of the rare earth element include lanthanum, cerium, neodymium, europium and ytterbium. Cerium is preferable.

The amount of the rare earth element compound in the present composition is such that the amount of the rare earth element is preferably 10 to 3,000 ppm, further preferably 50 to 1,000 ppm, relative to a total 100 parts by mass of components (A) to (C), but not limited to these. When the rare earth element compound is contained in the aforesaid amount, the effect of inhibiting degradation of the silicone resin is sufficiently attained.

The present silicone composition may further comprises other additives such as inorganic fillers such as white pigments, silica and fluorescent materials, diluents, pH adjusting agents and anti-aging agents. These additives may be properly added in such an amount that the effects of the present invention are not obstructed.

Examples of the inorganic filler include oxides, nitrides, sulfides, and complex oxides or complex compounds of these, which comprise a metal element such as Si, Al, Ti, Zr, Fe, Ca, Mg, Sr, Ba, Y, Zn, Cu, Cr, Nb, Ni, Ce, Mn, Sn, Cd, Se, Li, Co, Eu and Ga or a non-metal element. For instance, silica, alumina, titanium dioxide, zirconia, barium titanate, yttrium aluminum garnet, cerium-doped yttrium aluminum garnet, europium doped barium sulfide aluminate and gallium nitride nickel can be used.

Examples of the diluent include solvents such as aromatic hydrocarbons such as toluene and xylene; ketones such as cyclohexanone and methylisobutylketone; and glycolether solvents such as polyethylene glycol monomethyl ether; and non-reactive short-chain silicone oils having 1 to 10 silicon atoms.

Examples of the pH adjusting agents include organic acids such as acetic acid and citric acid, and organic bases such as pyridine and N, N-dimethylaniline.

Examples of anti-aging agents include benzoic acid, isopropylmethylphenol, ethylhexanediol, lysozyme chloride, chlorhexidine hydrochloride, octylphenoxyethanol and orthophenylphenol.

The present invention is characterized in that the silazane compound (C) is used as a catalyst in the method for preparing a cured product of the condensation-curable silicone resin composition. Components (A) and (B) are reacted in the presence of the silazane compound (C) as a catalyst to prepare a cured product. Curing conditions in the condensation reaction are not particularly limited and according to the known manners. For instance, the composition may be cured at 60 to 200 degrees C. for 1 to 48 hours. In particular, the composition is cured stepwise in the range of 60 to 200 degrees C. The stepwise curing consists preferably of the following two steps. The silicone resin composition comprising components (A) to (C) is first heated at 60 to 100 degrees C. for 0.5 to 4 hours to be defoamed sufficiently. Subsequently, the composition is heated at 120 to 200 degrees C. for 1 to 48 hours to cure. Through these steps, the composition is sufficiently cured, no bubble occurs and the cured product is colorless and transparent, even when a cured product has a large thickness. The thickness of the cured product is generally 0.3 to 2 mm, but not limited to these. In the present specification, "colorless and transparent" means that a light transmittance at 450 nm of a cured product having a thickness of 1 mm is 80% or more, preferably 85% or more, particularly preferably 90% or more.

The present composition is liquid at room temperature, that is, at 23 degrees C. The viscosity of the present composition at 23 degrees C. is not limited and may be high or low. Particularly, the liquid composition having a low viscosity is preferable. The liquid composition preferably has a low viscosity of 0.1 to 100 Pa·s, more preferably 1 to 50 Pa·s, further preferably 2 to 20 Pa·s, as determined with a rotational viscometer according to the Japanese Industrial Standards (JIS) K 7117-1:1999. The present composition prevents to increase its viscosity at room temperature and, thereby, has a good handling property. Further, the present condensation-curable silicone resin composition provides a cured product having a high transparency. Accordingly, the present condensation-curable silicone resin composition is useful as an encapsulating material for LED elements, in particular blue LED elements and violet LED elements. The encapsulation of LED elements with the present silicone composition may be carried out in any known manners. For instance, a dispense method and a compression molding method may be used.

The present condensation-curable silicone resin composition has an excellent handling property and provides a cured product having good crack resistance, heat resistance, light resistance and transparency. Accordingly, the present silicone composition and the cured product are useful also as materials for displays, optical recording mediums, optical apparatus, optical components, optical fibers, photo/electron functional organic materials and materials for integrated semiconductor circuit-related elements.

EXAMPLES

The present invention will be explained below in further detail with reference to a series of the Examples and the Comparative Examples, though the present invention is in no way limited by these Examples.

Components (A) to (C) used in the Examples and the Comparative Examples will be explained below. In the following description, Me is an abbreviation for a methyl group, Et is an abbreviation for an ethyl group, iPr is an abbreviation for an isopropyl group, and Ph is an abbreviation for a phenyl group. The bonding order of the parenthesized siloxane units in the following organopolysiloxane may form a block unit or bond randomly.

(A) Branched Organopolysiloxane (A-1) a branched organopolysiloxane, ex Shin-Etsu Chemical Co., Ltd., represented by the following formula: $(Me_3SiO_{1/2})_4(PhSiO_{3/2})_{16}(O_{1/2}H)_4$ (A-2) a branched organopolysiloxane, ex Shin-Etsu Chemical Co., Ltd., represented by the following formula: $(Me_3SiO_{1/2})_5(Me_2SiO_{2/2})_{100}(PhSiO_{3/2})_{15}(O_{1/2}H)_4$ (A-3) a branched organopolysiloxane, ex Shin-Etsu Chemical Co., Ltd., represented by the following formula: $(Me_3SiO_{1/2})_{30}(SiO_{4/2})_{45}(O_{1/2}R)_6$, wherein the organopolysiloxane is a mixture of the compound wherein R is, independently of each other, H or iPr.

(A-4) a branched organopolysiloxane, ex Shin-Etsu Chemical Co., Ltd., represented by the following formula: $(Me_3SiO_{1/2})_{180}(SiO_{4/2})_{60}$, wherein the organopolysiloxane is a mixture of the compound wherein R is, independently of each other, H or Et.

(A-5) a branched organopolysiloxane, ex Shin-Etsu Chemical Co., Ltd., represented by the following formula: $(Me_3SiO_{1/2})_{30}(Me_2SiO_{2/2})_{30}(MeSiO_{3/2})_{190}(O_{1/2}R)_{50}$, wherein the organopolysiloxane is a mixture of the compound wherein R is, independently of each other, H or Me.

(B) Linear Organopolysiloxane (B-1) a linear organopolysiloxane, ex Shin-Etsu Chemical Co., Ltd., represented by the following formula: $HO_{1/2}$—$(PhMeSiO_{2/2})_{30}$—$O_{1/2}H$ (B-2) a linear organopolysiloxane, ex Shin-Etsu Chemical Co., Ltd., represented by the following formula: $RO_{1/2}$-$(Me_2SiO_{2/2})_{300}$—$O_{1/2}R$, wherein the organopolysiloxane is a mixture of the compound wherein R is, independently of each other, H or Me.

(B-3) a linear organopolysiloxane, ex Shin-Etsu Chemical Co., Ltd., represented by the following formula: $RO_{1/2}$-$(Me_2SiO_{2/2})_{1980}$—$O_{1/2}R$ wherein the organopolysiloxane is a mixture of the compound wherein R is, independently of each other, H or Me.

(B-4) a linear organopolysiloxane, ex Shin-Etsu Chemical Co., Ltd., represented by the following formula: $(RO)_3SiO_{1/2}$-$(Me_2SiO_{2/2})_{200}$—$O_{1/2}Si(OR)_3$ wherein R is Me.

(C) Silazane Compound (C-1) Hexamethylcyclotrisilazane, ex Shin-Etsu Chemical Co., Ltd.:

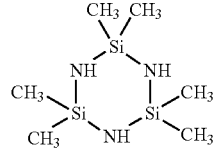

(C-2) Trimethyltriphenylcyclotrisilazane, ex Shin-Etsu Chemical Co., Ltd.:

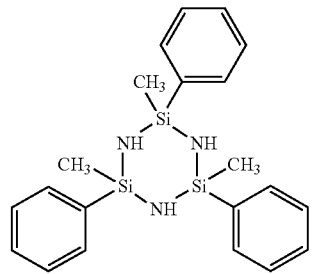 [SMILES: C[Si]1(c2ccccc2)N[Si](C)(c2ccccc2)N[Si](C)(c2ccccc2)N1]

(C-3) Tris(trimethylsilyl)amine, ex Shin-Etsu Chemical Co., Ltd.:

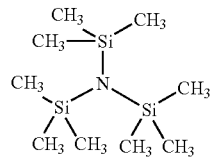

(C-4) Bis(trimethylsilyl)amine, ex Shin-Etsu Chemical Co., Ltd.:

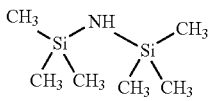

(C-5) Inorganic polysilazane consisting of the following units, ex Shin-Etsu Chemical Co., Ltd.:

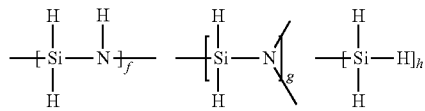

wherein f is 180, g is 124 and h is 31. The bonding order of the parenthesized silazane units in the organopolysiloxane may form a block unit or bond randomly.

(C-6) Organic polysilazane consisting of the following units, ex Shin-Etsu Chemical Co., Ltd.:

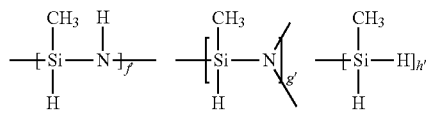

wherein f' is 40, g' is 15 and h' is 3. The bonding order of the parenthesized silazane units in the organopolysiloxane may form a block unit or bond randomly.

(C') Condensation catalyst for comparative examples (C'-1) Heptylamine, ex Tokyo Chemical Industry Co., Ltd.

(C'-2) Orgatics TC-750, containing 11.2 mass % of Ti, ex Matsumoto Fine Chemical Co. Ltd.

[Examples 1 to 6 and Comparative Examples 1 to 2]

Components (A) and (B) were mixed in amounts as described in Table 1, to which component (C) or (C') was then added and further mixed to prepare a condensation-curable silicone resin composition. The condensation-curable silicone resin compositions prepared in the Examples and the Comparative Examples were evaluated according to the following manners.

(1) Viscosity of the Condensation-Curable Silicone Resin Composition

An initial viscosity of the condensation-curable silicone resin composition was determined with a B-type viscometer at 23 degrees C. according to the Japanese Industrial Standards (JIS), Z 8803:2011. The composition was left in the atmosphere at 23 degrees C. for 4 hours and, a the viscosity was determined. A ratio of the viscosities was calculated according to the following equation: Ratio=[Viscosity after 4 hours]/[Initial viscosity]. The results are as shown in Table 2.

(2) Curing Time

The curing time was determined according to JIS K 6910:2007. That is, approximately 0.5 g of the condensation-curable silicone resin composition was put on a hot plate heated at 150 degrees C. and, immediately, a stopwatch was started. Immediately after the composition were put on the hot plate, the composition was quickly spread uniformly into an area of approximately 4 cm×7.5 cm with an edge of a metal spatula having a length of approximately 10 cm and a width of approximately 1.25 cm, then, the spatula was moved back and forth while applying a mild pressure to the composition. One round of the back-and-forth motion took 3 seconds. The back-and-forth motion was continued until the composition did not show gooey string. This was an end point. The time until the end point was recorded as a curing time. The determination of the curing time was conducted three times. The average curing time is as shown in Table 2.

(3) Hardness of a Cured Product

The condensation-curable silicone resin composition was poured into an aluminum-made petri dish having a diameter of 50 mm and a depth of 10 mm and, then, heated at 60 degrees C. for one hour, 100 degrees C. for one hour and, subsequently, 150 degrees C. for 4 hours to obtain a cured product. A hardness of the cured product was determined with a durometer of type A according to the JIS K 6253-3: 2012. The results are as shown in Table 2.

(4) Light Transmittance of a Cured Product

A concave Teflon (trademark) spacer having a thickness of 1 mm was sandwiched by two glass slides having dimensions of 50 mm×20 mm×1 mm and tightly held. The condensation-curable silicone resin composition was poured into the Teflon spacer and cured stepwise at 60 degrees C. for one hour, 100 degrees C. for one hour and, subsequently, 150 degrees C. for 8 hours to obtain a cured product. A transmittance of the cured product at 450 nm was determined with a spectrophotometer, 0-4100, ex Hitachi High-Technologies Corporation. The results are as shown in Table 2.

(5) Heat Resistance

The cured product prepared as in the aforesaid light transmittance test procedure was left in the atmosphere at 200 degrees C. for 1,000 hours. A transmittance of the cured product at 450 nm was determined with a spectrophotometer, 0-4100, ex Hitachi High-Technologies Corporation. The results are as shown in Table 2.

(6) Tensile Strength and an Elongation at Break of a Cured Product

The silicone resin composition was poured into a Teflon (trademark) mold having a cavity of 150 mm×200 mm×2 mm, and cured stepwise at 60 degrees C. for one hour, 100 degrees C. for one hour and, subsequently, 150 degrees C. for 8 hours to obtain a cured product. A tensile strength and an elongation at break of the cured product were determined according to JIS K 6251:2010 with a testing apparatus, EZ TEST, EZ-L, ex Shimadzu Corporation, in the following conditions: a tensile speed was 500 mm/min, a distance between clamps was 80 mm, and a distance of gauge points was 40 mm. The results are as shown in Table 2.

(7) Thermal Cycle Test (TCT)

The silicone resin composition was dispensed on a Tiger3528 package, ex Shin-Etsu Chemical Co. Ltd., and cured stepwise at 60 degrees C. for one hour, 100 degrees C.

for one hour and, subsequently, 150 degrees C. for 8 hours to cure to obtain a sample package encapsulated with the cured product. The 20 samples were subjected to a thermal cycle test (TCT) with 1000 thermal cycles of −50 to 140 degrees C. and vice-versa. The number of the sample packages which had cracks was recorded. The results are as shown in Table 2.

TABLE 1

|     |       | Ex. 1 | Ex. 2 | Ex. 3 | Ex. 4 | Ex. 5 | Ex. 6 | Com. Ex. 1 | Com. Ex. 2 |
|-----|-------|-------|-------|-------|-------|-------|-------|------------|------------|
| (A) | (A-1) | 100   | 100   |       |       |       |       | 100        | 100        |
|     | (A-2) |       |       | 100   |       |       |       |            |            |
|     | (A-3) |       |       |       | 100   |       |       |            |            |
|     | (A-4) |       |       |       |       | 100   |       |            |            |
|     | (A-5) |       |       |       |       |       | 100   |            |            |
| (B) | (B-1) | 100   | 100   |       |       |       |       | 100        | 100        |
|     | (B-2) |       |       |       | 100   | 300   | 250   |            |            |
|     | (B-3) |       |       | 10    | 100   |       |       |            |            |
|     | (B-4) |       |       |       |       | 150   |       |            |            |
| (C) | (C-1) | 1     |       |       |       |       |       |            |            |
|     | (C-2) |       | 2     |       |       |       |       |            |            |
|     | (C-3) |       |       | 20    |       |       |       |            |            |
|     | (C-4) |       |       |       | 10    |       |       |            |            |
|     | (C-5) |       |       |       |       | 10    |       |            |            |
|     | (C-6) |       |       |       |       |       | 20    |            |            |
| (C') | (C'-1) |     |       |       |       |       |       | 2          |            |
| Comparative condensation catalyst | (C'-2) |  |  |  |  |  |  |   | 0.5        | contrast, the ratio of the viscosities at room temperature of the present composition is small. That is, increase of the viscosity is prevented.

Further, as seen in Comparative Examples 1 and 2, the cured product obtained from the composition containing the amine catalyst or the metal catalyst causes cracks in the TCT, and the transmittance of the cured product decreases at 200 degrees C. after 1000 hours. Thus, the heat resistance and the crack resistance of the cured product are poor. In contrast, the cured product obtained from the present composition does not cause cracks in the TCT, and the transmittance of the cured product does not decrease at 200 degrees C. after 1000 hours. Thus, the cured product has excellent heat resistance and crack resistance.

INDUSTRIAL APPLICABILITY

The present condensation-curable silicone resin composition has good handling property and provides a cured product having high reliability such as a heat resistance. Accordingly, a semiconductor element may be encapsulated with the cured product of the present condensation-curable silicone resin composition to thereby provide a semiconductor device having excellent reliability. Further, the present condensation-curable silicone composition provides a cured product having a high light transmittance, so that the present condensation-curable silicone composition is usable as an encapsulating material for LEDs, in particular, blue LEDs and ultraviolet LEDs.

TABLE 2

|            |                |                                              |        | Ex. 1 | Ex. 2 | Ex. 3 | Ex. 4 | Ex. 5 | Ex. 6 | Com. Ex. 1 | Com. Ex. 2 |
|------------|----------------|----------------------------------------------|--------|-------|-------|-------|-------|-------|-------|------------|------------|
| Evaluation | Viscosity      | 23 degrees C., Initial                       | Pa · s | 4.6   | 4.5   | 9.2   | 6.8   | 8.6   | 5.8   | 3.6        | 3.8        |
|            |                | 23 degrees C., after 4 hours                 | Pa · s | 4.8   | 4.6   | 9.2   | 7.0   | 9.2   | 6.1   | gelled     | 8.0        |
|            | Ratio of the viscosities | Viscosity after 4 hours/Initial viscosity | — | 1.04 | 1.02 | 1.00 | 1.03 | 1.07 | 1.05 | — | 2.11 |
|            | Curing time    | 150 degrees C.                               | min    | 16    | 14    | 18    | 14    | 8     | 10    | 3          | 15         |
|            | Hardness       | Type A                                       | —      | 78    | 80    | 45    | 35    | 31    | 51    | 79         | 77         |
|            | Transmittance  | Initial, Thickness of 1 mm, 450 nm           | % T    | 99.7  | 99.8  | 99.7  | 99.7  | 99.6  | 99.6  | 99.7       | 99.6       |
|            | Heat resistance | 200 degrees C., 1000 hr Thickness of 1 mm, 450 nm | % T | 99.6 | 99.6 | 99.4 | 99.5 | 99.3 | 99.4 | 76.4 | 91.3 |
|            | Tensile strength | 25 degrees C.                              | MPa    | 2     | 2.1   | 1.9   | 1.6   | 1.1   | 3.4   | 2.2        | 2          |
|            | Elongation at break | 25 degrees C.                           | %      | 160   | 160   | 140   | 170   | 190   | 110   | 150        | 160        |
|            | Thermal cycle test | 1000 thermal cycles of −50 to/from 140 degrees C. | Number of the cracked samples | 0/20 | 0/20 | 0/20 | 0/20 | 0/20 | 0/20 | 20/20 | 20/20 |

As seen in Table 2, Examples 1 to 6, the condensation-curable silicone resin composition which contained the silazane compound as a condensation catalyst cures quickly by heating at 150 degrees C. to provide a colorless and transparent product.

The viscosity of the composition which contained an amine catalyst or a metal catalyst increases at room temperature, as seen in Comparative Examples 1 and 2. In

The invention claimed is:

1. A LED element encapsulated with a cured product obtained by curing an encapsulating composition for semiconductor devices, wherein the encapsulating composition comprises the following components (A) to (C):
  (A) 100 parts by mass of an organopolysiloxane which has a branched or network structure, has two or more hydrolyzable groups each bonded to a silicon atom and at least one ($R^1SiO_{3/2}$) unit, wherein $R^1$ is, independently of each other, a hydrogen atom or a substituted or unsubstituted, monovalent hydrocarbon group having 1 to 12 carbon atoms,
(B) 5 to 500 parts by mass of a linear organopolysiloxane having at least one hydrolyzable group bonded to a silicon atom at each of both terminals, and
(C) at least one silazane compound represented by the following general formula (3), (3') or (5) or comprising the following units (6) in an amount of 0.02 to 30 parts by mass, relative to total 100 parts by mass of components (A) and (B):

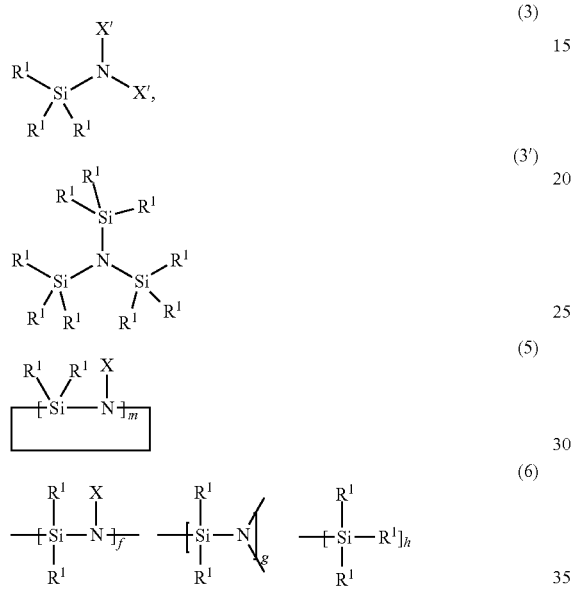

wherein X' is, independently of each other, a hydrogen atom or a monovalent hydrocarbon group having 1 to 12 carbon atoms, $R^1$ is, independently of each other, a hydrogen atom or a substituted or unsubstituted, monovalent hydrocarbon group having 1 to 12 carbon atoms, m is an integer of from 3 to 8, f is an integer of from 1 to 500, g is an integer of from 0 to 500, h is an integer of from 0 to 200, provided that the total of f, g and h is 10 to 500, the parenthesized silazane units may form a block unit or bond randomly, and X is, independently of each other, a hydrogen atom, a monovalent hydrocarbon group having 1 to 12 carbon atoms, or a group represented by the following formula (4):

$$\begin{array}{c} R^1 \\ | \\ -Si-R^1 \\ | \\ R^1 \end{array} \qquad (4)$$

wherein $R^1$ is, independently of each other, a hydrogen atom or a substituted or unsubstituted, monovalent hydrocarbon group having 1 to 12 carbon atoms,
provided that the composition comprises neither any amine compound catalyst besides said silazane compound nor any organic metal catalyst.

2. An encapsulating composition for semiconductor devices comprising the following components (A) to (C):
(A) 100 parts by mass of an organopolysiloxane which has a branched or network structure, has two or more hydrolyzable groups each bonded to a silicon atom and at least one $(R^1SiO_{3/2})$ unit, wherein $R^1$ is, independently of each other, a hydrogen atom or a substituted or unsubstituted, monovalent hydrocarbon group having 1 to 12 carbon atoms,
(B) 5 to 500 parts by mass of a linear organopolysiloxane having at least one hydrolyzable group bonded to a silicon atom at each of both terminals, and
(C) at least one silazane compound represented by the following general formula (3), (3') or (5) or comprising the following units (6) in an amount of 0.02 to 30 parts by mass, relative to total 100 parts by mass of components (A) and (B):

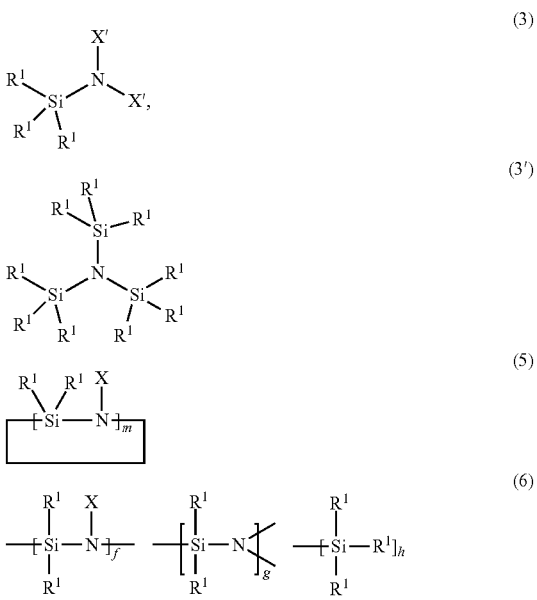

wherein X' is, independently of each other, a hydrogen atom or a monovalent hydrocarbon group having 1 to 12 carbon atoms, $R^1$ is, independently of each other, a hydrogen atom or a substituted or unsubstituted, monovalent hydrocarbon group having 1 to 12 carbon atoms, m is an integer of from 3 to 8, f is an integer of from 1 to 500, g is an integer of from 0 to 500, h is an integer of from 0 to 200, provided that the total of f, g and h is 10 to 500, the parenthesized silazane units may form a block unit or bond randomly, and X is, independently of each other, a hydrogen atom, a monovalent hydrocarbon group having 1 to 12 carbon atoms, or a group represented by the following formula (4):

$$\begin{array}{c} R^1 \\ | \\ -Si-R^1 \\ | \\ R^1 \end{array} \qquad (4)$$

wherein $R^1$ is, independently of each other, a hydrogen atom or a substituted or unsubstituted, monovalent hydrocarbon group having 1 to 12 carbon atoms,
provided that the composition comprises neither any amine compound catalyst besides said silazane compound nor any organic metal catalyst, and further comprising a rare earth element compound.

3. The encapsulating composition for semiconductor devices according to claim 2, wherein the rare earth element compound is at least one compound selected from the group consisting of an organic complex of a rare earth element, a rare earth element alkoxide having an alkoxy group, and an organic acid salt of a rare earth element via an organic acid.

4. The encapsulating composition for semiconductor devices according to claim 2, wherein the rare earth element is at least one element selected from the group consisting of lanthanum, cerium, neodymium, europium, and ytterbium.

5. The encapsulating composition for semiconductor devices according to claim 2, wherein an amount of the rare earth element is 10 to 3,000 ppm relative to a total 100 parts by mass of the components (A), (B) and (C).

6. The LED element according to claim 1, wherein component (A) is represented by the following general formula (1):

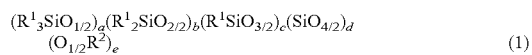
(1)

wherein $R^1$ is, independently of each other, a hydrogen atom or a substituted or unsubstituted, monovalent hydrocarbon group having 1 to 12 carbon atoms, $R^2$ is, independently of each other, a hydrogen atom or a monovalent hydrocarbon group which has 1 to 6 carbon atoms and may have an oxygen atom, a is an integer of from 0 to 500, b is an integer of from 0 to 1,000, c is an integer of from 1 to 500, d is an integer of from 0 to 500, provided that a total of c and d is 3 to 500, e is an integer of from 2 to 100, and the parenthesized silazane units may form a block unit or bond randomly.

7. The LED element according to claim 1, wherein component (B) is represented by the following general formula (2):

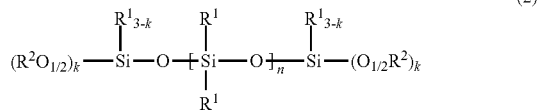
(2)

wherein $R^1$ is, independently of each other, a hydrogen atom or a substituted or unsubstituted, monovalent hydrocarbon group having 1 to 12 carbon atoms, $R^2$ is, independently of each other, a hydrogen atom or a monovalent hydrocarbon group which has 1 to 6 carbon atoms and may have an oxygen atom, k is, independently of each other, an integer of from 1 to 3, and n is an integer of from 1 to 2,000.

8. The encapsulating composition for semiconductor devices according to claim 2, wherein component (A) is represented by the following general formula (1):

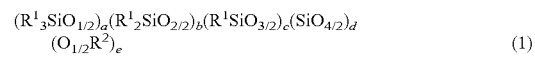
(1)

wherein $R^1$ is, independently of each other, a hydrogen atom or a substituted or unsubstituted, monovalent hydrocarbon group having 1 to 12 carbon atoms, $R^2$ is, independently of each other, a hydrogen atom or a monovalent hydrocarbon group which has 1 to 6 carbon atoms and may have an oxygen atom, a is an integer of from 0 to 500, b is an integer of from 0 to 1,000, c is an integer of from 1 to 500, d is an integer of from 0 to 500, provided that a total of c and d is 3 to 500, e is an integer of from 2 to 100, and the parenthesized silazane units may form a block unit or bond randomly.

9. The encapsulating composition for semiconductor devices according to claim 2, wherein component (B) is represented by the following general formula (2):

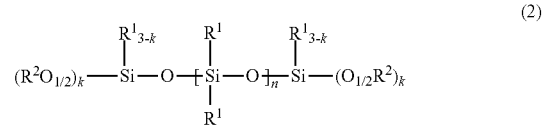
(2)

wherein $R^1$ is, independently of each other, a hydrogen atom or a substituted or unsubstituted, monovalent hydrocarbon group having 1 to 12 carbon atoms, $R^2$ is, independently of each other, a hydrogen atom or a monovalent hydrocarbon group which has 1 to 6 carbon atoms and may have an oxygen atom, k is, independently of each other, an integer of from 1 to 3, and n is an integer of from 1 to 2,000.

* * * * *